(12) United States Patent
Biegelsen

(10) Patent No.: US 6,267,605 B1
(45) Date of Patent: Jul. 31, 2001

(54) SELF POSITIONING, PASSIVE MEMS MIRROR STRUCTURES

(75) Inventor: David K. Biegelsen, Portola Valley, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/440,446

(22) Filed: Nov. 15, 1999

(51) Int. Cl.[7] ............................. H01R 12/00; H05K 1/00
(52) U.S. Cl. .............................. 439/81; 439/66; 200/245; 200/275
(58) Field of Search ................... 439/81, 66, 843, 439/844, 845, 74; 200/245, 275, 246

(56) References Cited

U.S. PATENT DOCUMENTS

| 3,842,189 | 10/1974 | Southgate . |
| 5,302,145 | * 4/1994 | Spinnato et al. ................. 439/843 |
| 5,613,861 | 3/1997 | Smith et al. . |
| 5,848,685 | 12/1998 | Smith et al. . |
| 5,914,218 | 6/1999 | Smith et al. . |
| 5,944,537 | * 8/1999 | Smith et al. ..................... 439/81 |
| 6,079,988 | * 6/2000 | Hashiguchi et al. .............. 439/66 |

OTHER PUBLICATIONS

Low Insertion Loss Packaged and Fiber–Connectorized Si Surface–Micromachined Reflective Optical Switch, (Aksyuk et al.) Solid–State Sensor and Actuator Workshop, Hilton Head Island, SC, Jun. 8–11, 1998.

* cited by examiner

Primary Examiner—Lincoln Donovan
Assistant Examiner—Kyung S. Lee
(74) Attorney, Agent, or Firm—Fay, Sharpe, Fagan, Minnich & McKee, LLP

(57) ABSTRACT

Provided is a micro-machine mirror structure with hinges which after being released from a sacrificial layer will result in the mirror structure being lifted out of the plane of the substrate to a fixed defined geometric angle. Stresses in a metal layer of the mechanism, along with a constraint mechanism, causes the mirror structure to be maintained at the desire angle.

9 Claims, 6 Drawing Sheets

SELF POSITIONING, PASSIVE MEMS MIRROR STRUCTURES

FIELD OF THE INVENTION

This invention generally relates to photolithographically patterned springs for use in self-assembling micro-electromechanical systems (MEMS) structures.

BACKGROUND OF THE INVENTION

A process has been developed which allows for the photolithographically patterning a spring formed on a substrate. An inherent stress gradient in the spring causes a free portion of the spring to bend up and away from the substrate.

Photolithographically generated springs have a variety of uses including providing electrical contact between separate connection pads onto devices. Particularly, the spring is patterned as a spring contact where the anchor portion fixed to the substrate is electrically connected to a first contact pad on the substrate. The free portion compliantly contacts a second contact pad, thereby electrically interconnecting the two contact pads. Thus, in the foregoing concept of moving a portion of a micro-machined structure out of a plane is used for improving electrical contact between devices.

Another implementation of a structure, which motivates a portion of a micro-machined structure out of a plane of the substrate, is a two-port reflective switch. Such a switch consists of a moveable shutter connected to an electrostatic out-of-plane actuator capable of inserting the shutter in the light path between two optical fibers.

SUMMARY OF THE INVENTION

A MEMS structure is provided including a substrate. Within the substrate is deposited a spring comprising of material initially fixed to the substrate along a length of the spring. The material forming the spring has an inherent stress gradient when initially fixed to the substrate. A non-stressed constraint plate is deposited on the substrate opposite the spring. The non-stressed constraint plate has a minimal inherent stress gradient. A hinged member has a first portion connected to the spring, and a second portion connected to the non-stressed constraint plate. A constraint mechanism is formed on the substrate such that at least a portion of the constraint plate is in control of the control mechanism. When at least a free portion of the spring and the constraint plate are released from the substrate, while an anchor portion of the spring remains fixed to the substrate, the inherent stress gradient of the spring biases the free portion of the spring away from the substrate. This occurs until the constraint mechanism constrains the spring from further movement.

With attention to another aspect of the present invention, the MEMS structure is self-assembling, in that as the spring biases the free portion away from the substrate, the constraint mechanism will fix the angle of the MEMS structure to a predetermined angle from the substrate surface.

With attention to yet another aspect of the present invention, a mirror is deposited on a surface of the free portion of the spring, or attached to the constraint member, such that the mirror may be positioned at a predetermined fixed angle.

With attention to yet another aspect of the present invention, the MEMS structure is self-assembling upon initial release, in the sense that it moves to the predetermined angle without a further motivating force. The MEMS structure is also collapsible and repeatedly self-assembling to the predetermined angle.

DETAILED DESCRIPTION OF THE PREFERRED EMBODIMENTS

The following material describes a repeatedly self assembling micro-machined structure which is lifted out of the plane of a substrate and moved into a fixed configuration. The micro-machined structure uses a spring film as a hinge to lift the structure out of the plane of a substrate, and has another micro-machined structure configuration to fix its angle. In a preferred embodiment, a mirror structure is micro-machined with the spring to form a device, which provides a self-assembling mirror configuration, which moves to a fixed predetermined angle.

Figure 1:
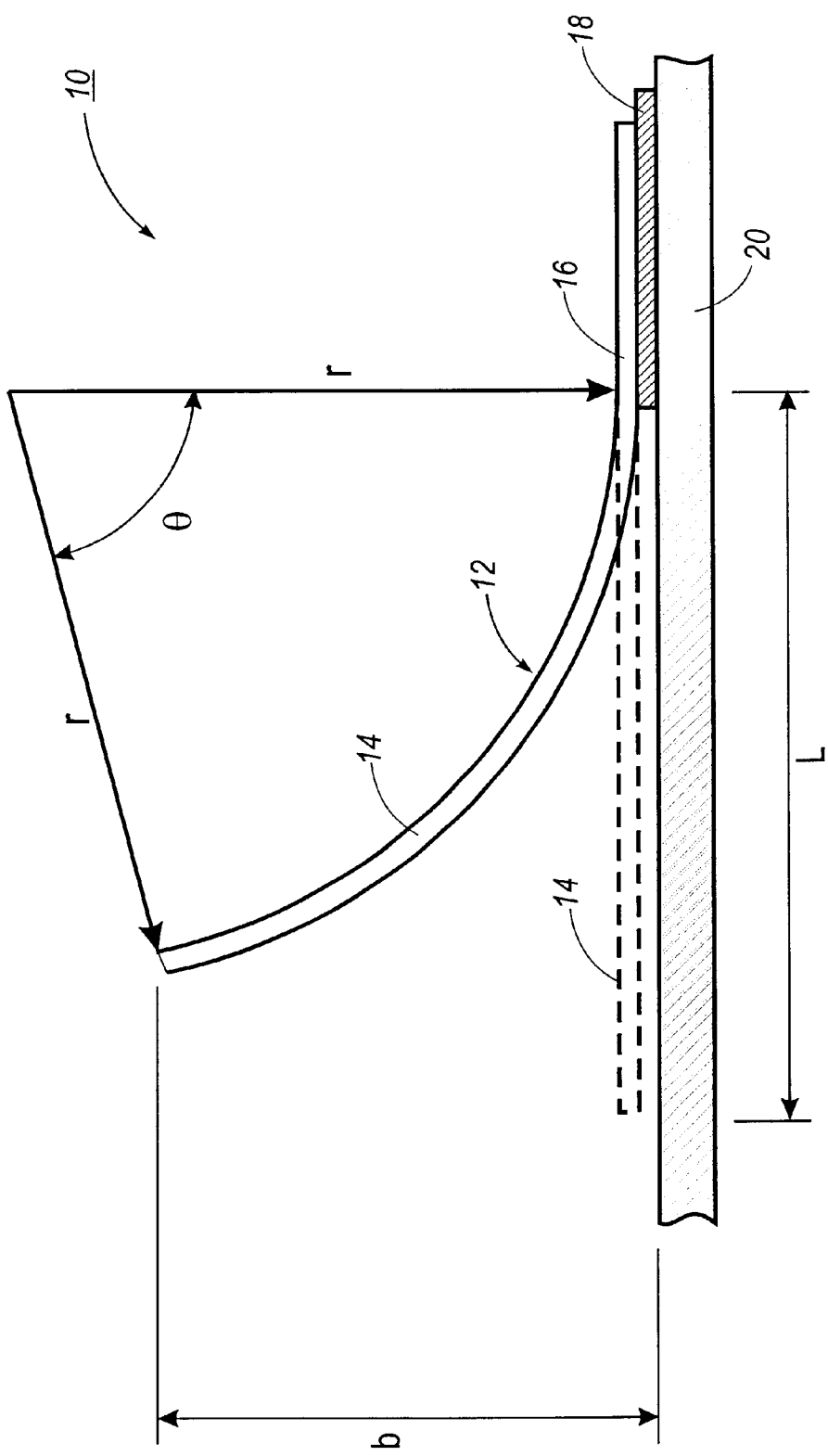
FIG. 1 is a spring in an undeformed free state and also shown in a deformed free state.

Turning to FIG. 1, illustrated is a micro-machine structure 10 showing the concept of a spring element 12 of the present invention. Each spring 12 comprises a free portion 14 and an anchor portion 16 fixed to a release layer 18. Free portion 14 is shown in dotted lines prior to being released from release layer 18, and in solid lines after being released. Each spring 12 is made of an elastic material, such as a chrome-molybdenum alloy or a nickel-zirconium alloy. Preferably, the springs 12 are formed of an elastic conductive material, although they can be formed of a non-conductive or semi-conductive material. More preferably, the springs 12 are formed of a nickel-zirconium alloy having 1% zirconium, a chrome-molybdenum alloy (20% CR-80% Mo), a tungsten (W)-based alloy, or a chromium (Cr) based alloy. Zirconium is added to the nickel in the nickel-zirconium alloy to improve the elastic properties of the alloy while not greatly reducing the conductivity of the nickel. When the elastic material is not conductive, it may be coated on at least one side with a conductive material, such as a metal or metal alloy.

The release layer 18 is made of silicon nitride or other etchable material, which can be electrically insulating or conducting. However, the release layer 18 is not necessary and can be eliminated. The release layer 18 is formed on or over a substrate 20, which in some embodiments is formed of an insulating material, such as oxidized silicon or glass.

Figure 2:
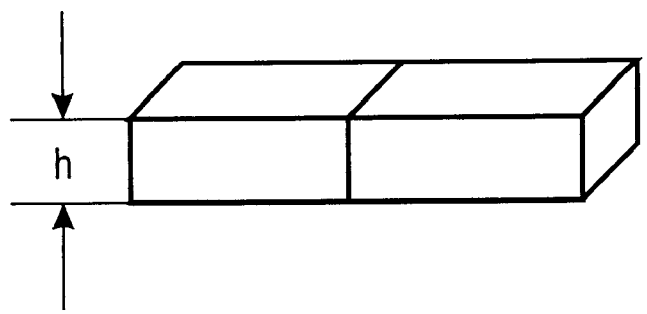
FIG. 2 shows a metal strip with no stress gradient.
Figure 3:
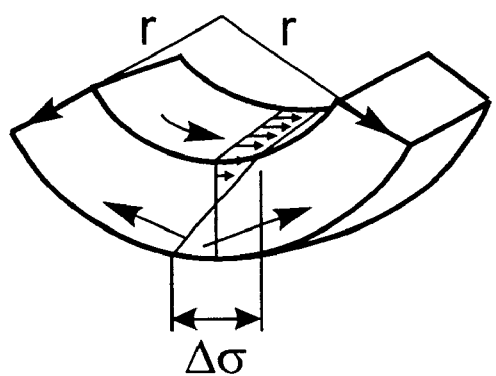
FIG. 3 shows a model for determining the curvature of a spring due to the stress gradient.

As shown in FIG. 2, a strip of metal having no stress gradient inherent in the metal will lie flat. However, as shown in FIG. 3, when the strip is bent into an arc, a uniform stress gradient Δσ/h is introduced into the strip, where Δσ is the total stress difference and h is the thickness of the metal layer. Likewise, if a uniform stress gradient Δσ/h is introduced into the flat metal strip, the metal strip will bend into an arc shape.

Each spring 12 is formed such that a stress gradient Δσ/h is introduced into the spring 12. When the spring 12 is formed, the metal layer comprising the spring 12 is deposited such that compressive stress is present in lower portions of the metal layer and tensile stress is present in upper portions of the metal layer. Compressive stress in lower portions of the metal layer is depicted by arrows directed toward the ends of the metal strip. Tensile stress is depicted in upper portions of the metal layer by arrows directed in from the ends of the metal strip. The stress gradient Δσ/h causes the spring 12 to bend into the shape of an arc having a radius r. Equation 1 gives the radius of curvature r of the spring 12:

$$r = \left(\frac{Y}{1-v}\right)\frac{h}{\Delta\sigma} \quad \text{(Eq. 1)}$$

where Y is the Young's modulus of the metal, h is the thickness of the metal layer forming the spring 12, Δσ is the total stress difference, and v is the Poisson's ratio of the metal.

Figure 4:
FIG. 4 shows the first steps and a method for forming a self-assembling mechanism according to the invention.

FIGS. 4–9 set forth the basic steps and concepts used in forming a self-assembling, geometrically constrained, micro-machined structure, which uses the concepts of spring 12. In FIG. 4, a release layer 18 is formed on or over the substrate 20. However, as mentioned above, the release layer 18 is not required and can be eliminated.

Figure 5:
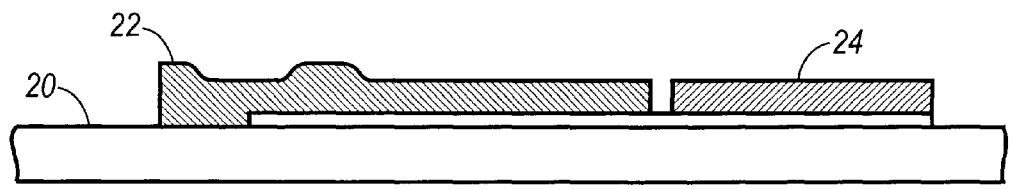
FIG. 5 shows additional steps following those shown in FIG. 4 in a method of forming a self-assembling MEMS structure according to the invention.

In FIG. 5, a layer of metal 22 is deposited on or over the substrate 20. In a preferred embodiment of the invention, the metal is the nickel-zirconium alloy described above. Part of the metal layer 22 is deposited on or over a portion of the release layer 18. There are many methods available for depositing the metal layer 22 on or over substrate 20, including electron-beam deposition, thermal evaporation, chemical vapor disposition, sputter deposition and other methods. Preferably, the metal layer 22 is sputter deposited.

When sputter-depositing a metal, a plate of the metal, called the target, is placed on a cathode, which is set to a high negative potential and immersed in a low-pressure, typically 1 to 100 millitorr, gas. This causes a glow-discharge plasma to ignite, from which positive ions are accelerated into the negatively charged target. This ion bombardment knocks metal atoms off the target, and many of these deposit on nearby surfaces, such as the substrate 20.

The metal layer 22 can be thought of as deposited in several sub-layers 22-1 to 22-n to a final thickness h of approximately 1 μm. The stress gradient Δσ/h is introduced into the metal layer 22 by altering the stress inherent in each of the sub-layers 22-1 to 22-n of the metal layer 22, such that each sub-layer 22-x has a different level of inherent stress.

Different stress levels can be introduced into each sub-layer 22-x of the deposited metal layer 22 during sputter deposition in a variety of ways, including adding a reactive gas to the plasma, depositing the metal at an angle, and changing the pressure of the plasma gas. Preferably, the different levels of stress are introduced into the metal layer 22 by varying the pressure of the plasma gas, which is preferably argon.

Figure 6:
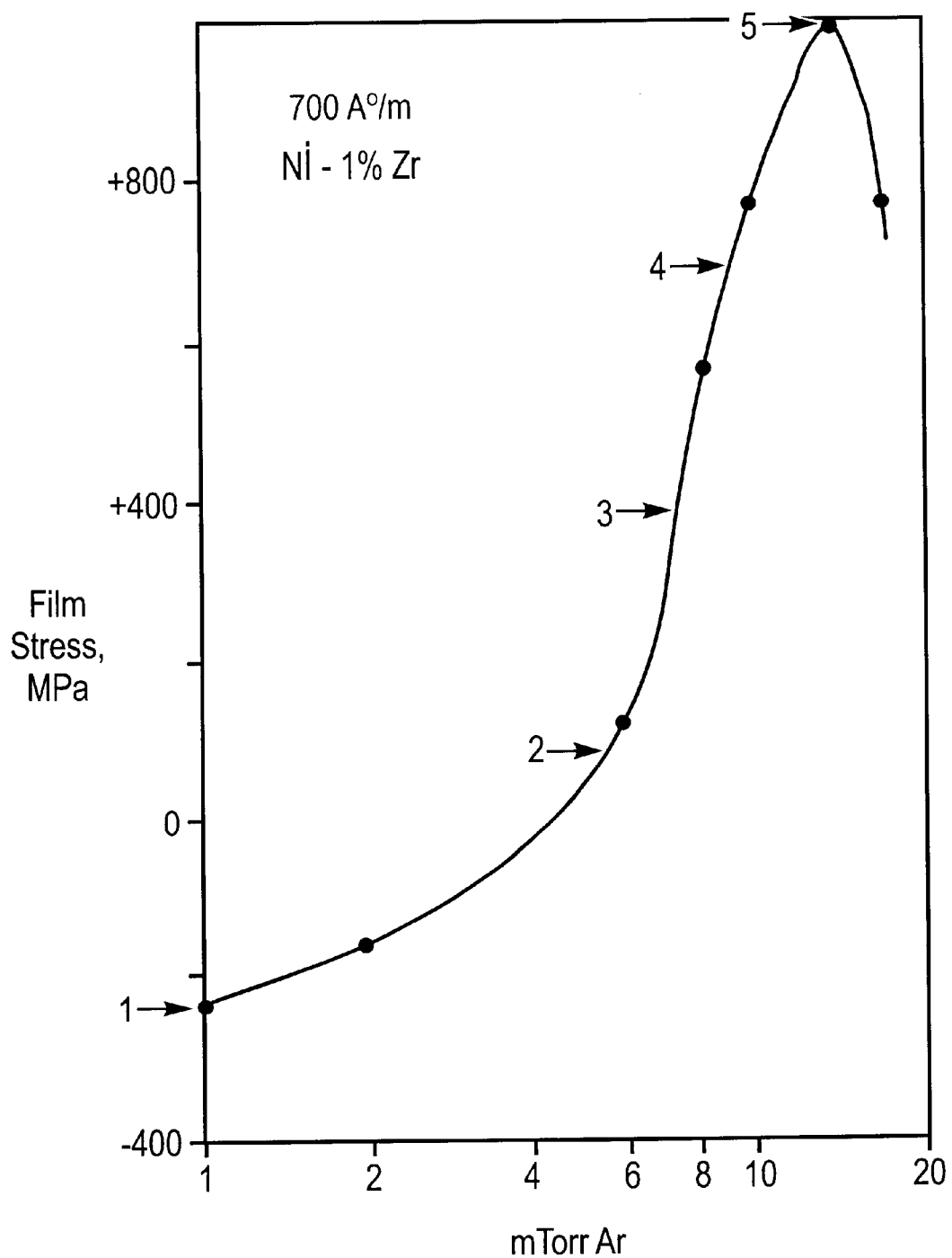
FIG. 6 is a graphic representation of the film stress in a sputter deposited nickel-zirconium alloy as a function of plasma gas pressure.

FIG. 6 is a graph showing a typical relationship of the film stress in the sputter deposited nickel-zirconium alloy and the pressure of the plasma gas used in the deposition. For low pressure of the plasma gas, approximately 1 mTorr, the film stress in the deposited metal is compressive. As the pressure of the plasma gas increases, the film stress in the deposited sub-layer changes to a tensile stress and increases with increasing plasma gas pressure.

In one embodiment, the metal layer 22 is deposited in five sub-layers 22-1 to 22-5. The first sub-layer 22-1 is deposited at a plasma gas pressure of 1 mTorr, as indicated by numeral 1 in FIG. 6. The first sub-layer 22-1 is the bottom-most layer in the metal layer 22 and has an inherent compressive stress. The second sub-layer 22-2 is deposited on top of the first sub-layer 22-1 at a plasma gas pressure of approximately 6 mTorr. The second sub-layer 22-2 has a slight inherent tensile stress, as indicated by numeral 2 in FIG. 6. Sub-layers 22-3, 22-4 and 22-5 are then deposited one on top of the other at the plasma gas pressures indicated by numerals 3, 4 and 5 in FIG. 6.

The process of depositing the metal layer 22 in five separate sub-layers 22-1 to 22-5 results in the metal layer 22 having a stress gradient Δσ/h which is compressive in the lower portion of the metal layer 22 and becomes increasingly tensile toward the top of the metal layer 16. Although the stress gradient Δσ/h urges the metal layer 16 to bend into an arc, the metal layer 22 adheres to the release layer 18 and the substrate 20, and thus lies flat.

Deposited on or over a separate portion of release layer 18, is a non-stressed metal layer 24 having no or minimal inherent stress gradient. Therefore, non-stressed metal layer 24 will lie flat over or on release layer 18. In an alternative embodiment, non-stressed metal layer 24 may be deposited on or over substrate 20, in case where release layer 18 is not used.

Figure 7:
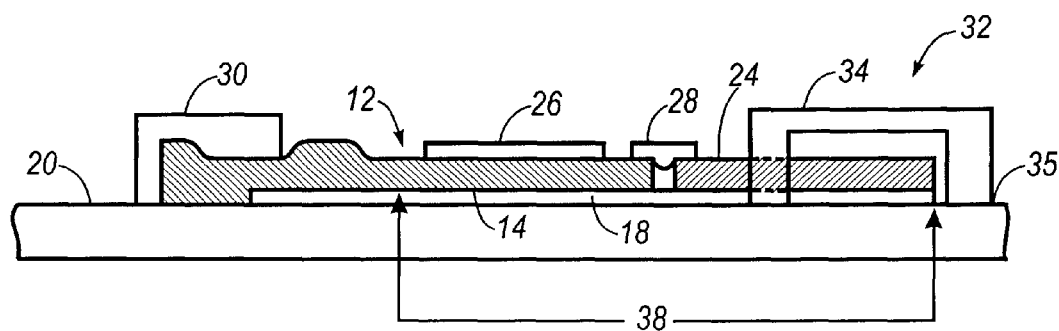
FIG. 7 is a side view graphical representation of a self-assembling MEMS structure according to the teachings of the present invention.

Turning to FIG. 7, deposited on an upper portion of metal layer 22 is a reflection layer 26. The reflection layer 26 is layered in such a manner as to effectively form a mirrored surface, such formation being accomplished by means well known in the art. A hinge structure 28 is deposited and patterned with a highly elastic material, such as aluminum or polyimide, and is positioned partially over the metal layer 22, the release layer 18, and the non-stressed metal layer 24. A polymer anchor element 30 is deposited on at least a portion of the substrate 20 and metal layer 22 as a holding member for metal layer 22.

A constraint structure 32 includes a pair of staples 34, and non-stressed metal layer 24. Legs 35 of staples 34 extend into or onto, in a fixed or bonded manner, substrate 20. By this design staples 34 are securely held in place when an upward force is exerted on the staples 34. As will be seen more clearly in FIG. 8, non-stressed metal layer 24 is formed with flanged ends located between end points of staples 34.

Figure 8:
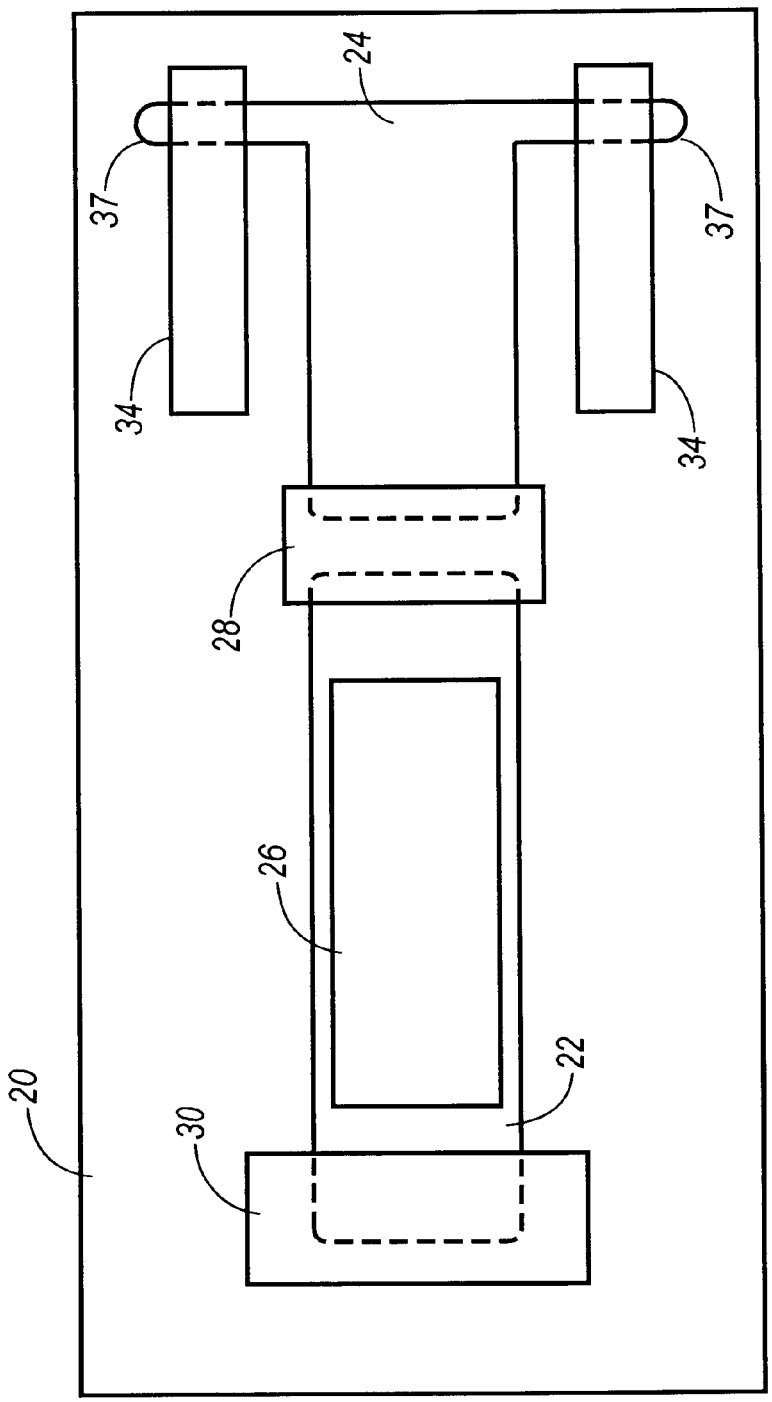
FIG. 8 shows a top view of FIG. 7.
Figure 9:
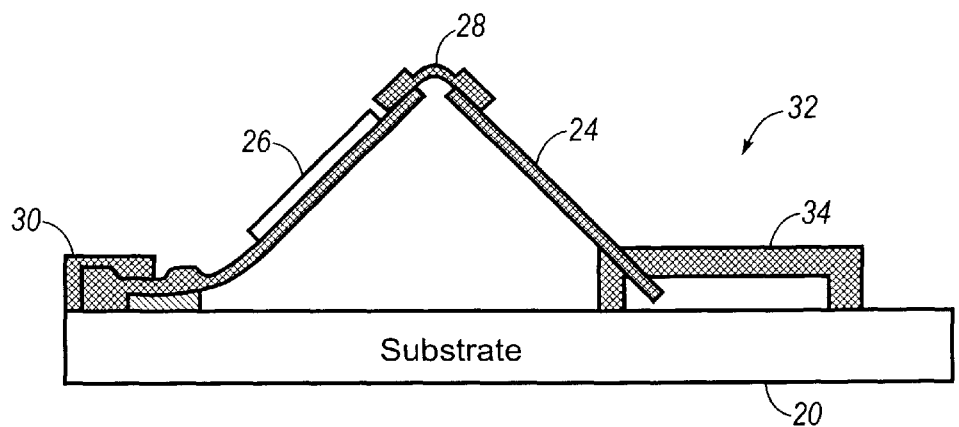
FIG. 9 depicts the self-assembling MEMS structure of the present invention in an extended or raised state.

FIG. 8 is a top view of the apparatus illustrated in FIG. 7. This view more clearly shows both staples 34, and their relationship with non-stressed layer 24. More particularly, non-stressed layer 22 is configured with flanges 37, which are located between the legs 35 of staples 34.

The non-stressed layer (hereafter also called constraint plate) 24 and a portion of hinge 28 are released from the release layer 18 by a process of under-cut etching. A similar operation is undertaken for the free portion 14 of spring 12. Until the free portion 14 is released from the release layer 18 the free portion 14 adheres to the release layer 18 and the spring 12 and non-stressed layer 24 lies flat on the substrate 20. There are two methods for releasing spring 12 from substrate 20 or release layer 18.

In the first method, the release layer 18, typically silicon nitride, is deposited by plasma chemical vapor deposition (PECVD) at a temperature of 200–250° C. This gives the release layer 18 a fast etch rate. The release layer 18 is then prepatterned, before the metal layer 22 and non-stressed layer 24 are deposited, into islands on which the spring 12 and non-stressed layer 24 will be formed. After the spring 12 and non-stressed layer 24 are formed on or over the islands of the release layer 18, the spring 12 and non-stressed layer 24 are released from the release layer 18 islands by etching the islands with a selective etchant. The selective etchant is typically a HF solution. The etchant is called a selective etchant because it etches the release layer 18 faster than the selective etchant removes metal from spring 12 and non-stressed layer 24. This means that spring 12 and non-stressed layer 24 are released from the release layer 18. This allows spring 12 to bend up and away from the release layer 18 due to the stress gradient $\Delta\sigma/h$ in the spring 12. The islands can also be formed of a low melting temperature material, such as solder or plastic. After the spring 12 is formed, the low melting temperature material is heated to release the spring 12. As the spring moves out of the plane of substrate 20, hinge 28 causes non-stressed layer (now acting as a constraint plate) 24 to also be moved out of the plane of the substrate. Further, the reflecting layer of mirror 26 also moves away from the substrate 20.

In the second method for releasing spring 12 and layer 24, release layer 18, if used, is not pre-patterned into islands. Instead, after spring 12 and non-stressed layer 24 are formed, a passivating layer, such as silicon oxynitride, is deposited on spring 12, layer 24, and the surrounding areas by PECVD. The passivation layer is patterned into windows to expose the free portion 14 of spring 12, non-stressed layer 24 and surrounding areas of the release layer 18. The same selective etchant, such as HF solution, is used to etch the release layer 18 and release spring 12 and non-stressed layer 24. This method avoids a step discontinuity in the metal of spring 12 at the anchor portion 30 edge and leaves an insulating cover on the anchor portion 30. The insulating cover protects the anchor portion 30 from, in certain environments, short-circuiting and also helps hold the anchor portion 30 down on the substrate 20.

As illustrated in FIGS. 7 and 8, only those areas 38 of the release layer 18 under the free portion 14 of spring 12 under the hinge 28, and under non-stressed layer 24 are under-cut etched. This means that the anchor portion 30 of spring 12 remains fixed to release layer 18 and does not pull away from release layer 18. It should be appreciated that the method for patterning metal layer 22 into spring 12 should not result in any annealing of the metal layer 22.

Additional steps can be added to the under-cut etching processes to improve the processes if necessary.

Again, once the free portion 14 is freed from release layer 18, the stress gradient $\Delta\sigma/h$ causes free portion 14 to bend up and away from substrate 20. The stress gradient $\Delta\sigma/h$ is still inherent in anchor portion 30 and urges anchor portion 30 to pull away from substrate 20.

To decrease the chance of anchor portion 30 pulling away from substrate 20, spring 12 can be annealed to relieve the stress anchor portion 30. This annealing process does not affect free portion 14 because, once free portion 14 is released and allowed to bend up, no stress remains on free portion 14 to be relieved by annealing. Thus, free portion 14 remains curved up and away from the substrate 20 after annealing.

Since the process for forming springs 12 is limited only by the design rules of photolithographic patterning, many hundreds or thousands of springs 12 can be formed closely together in a relatively small area on the substrate 20. The typical width of the spring 12 is 10–100 $\mu$m. Therefore, the springs 12 can be formed close together, at a spacing of approximately 10–20 $\mu$m. This makes the center-center-distance between adjacent springs approximately 20–120 $\mu$m.

The inventor has realized that in many applications it may be desirable to have a MEMS structure, which self-assembles to an out-of-the-substrate plane position, where movement of the structure is to a predetermined fixed angle, determined by geometric constraints. This concept is accomplished by a structure configured in accordance with FIGS. 4–8, and is shown in an out-of-plane state, in FIG. 9.

Particularly, once the release layer 18 has been appropriately etched, the spring 12 which carries reflection layer or mirror 26 moves out of the plane of the substrate to a predetermined desired fixed angle. As can be seen from FIG. 9, reflection layer or mirror 26, is constrained from being further lifted out of the plane of the substrate 20 by operation of the constraint mechanism 32 interacting with spring 12. As constraint plate 24 is moved out of the plane of the substrate 20, it will continue to rise until the ledges 37 of constraint plate 24 engages the legs 35 of staples 34, and tension created by the geometric triangular structure stop further movement of spring 12. This design allows for a repeatable fixed angle to be obtained upon release of spring 12. The constraint mechanism of the present invention is shown by the foregoing description to be self-assembling. It is to be understood that mirror 26 may also be formed on constraint plate 24, and be moved to a fix angle as constraint plate 24 is moved out of the plane of substrate 20.

The present invention thus uses the stress of the metal layer 22 to lift the structure out of the plane of the substrate and uses the constraint mechanism 32 to hold the mirror mechanism 26 at a specific angle. This structure may be used in a situation where it is desired to have the geometry of the mirror angle well defined.

Thus, the present invention uses a combination of the stress induced motion out of the substrate plane, with a fixed geometric constraint. A variety of self-assembling devices may be manufactured having different angles at which they become fixed, in accordance with the present teachings. The different angles may be obtained by altering the relationship between the springs 12 and constraint mechanism 32, for the different devices.

A specifically constrained mechanism as described above may be used in laser printing applications, data transmission, among other uses.

Figure 10:
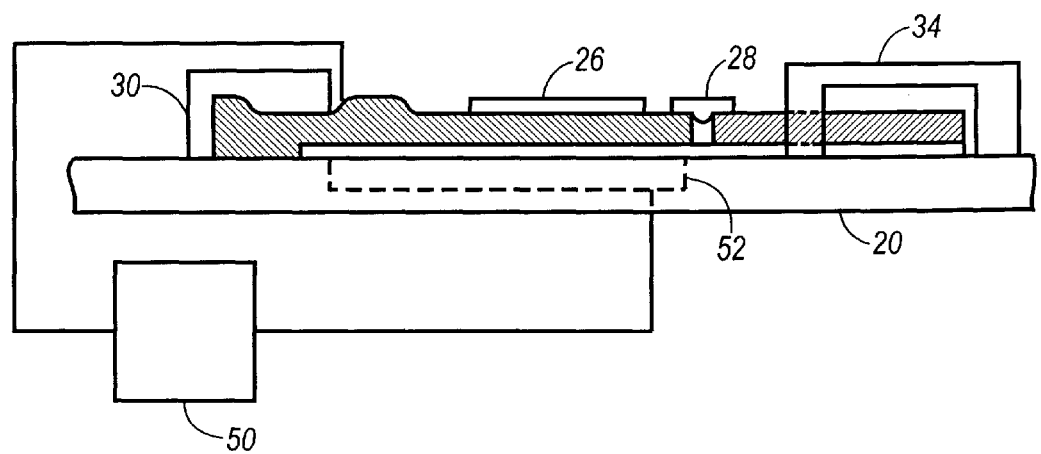
FIG. 10 illustrates the MEMS structure of FIG. 9 in a collapsed state due to the application of a voltage.

As a further feature of the present invention, and as illustrated in FIG. 10, by application of appropriate electrical potentials, it is possible, to pull the MEMS structure back down into the plane of the substrate 20. In particular, by applying a voltage from voltage source 50, across the substrate 20 and the metal layer 22, potential differences are used to cause the structure to collapse back into the plane of substrate 20. Once the voltage is removed, the structure will move back to its fixed angle position due to the stresses in layer 22. In this embodiment, substrate 20 will be formed of an appropriate conductive material. Alternatively a metal pad 52 may be deposited on or near the substrate 20, in order to provide a potential relative to that applied to the spring metal layer 22.

By this construction, the present invention is repeatedly self-assembling in the sense that upon the initial removal of the sacrificial release layer 18, the metal layer 22 will cause the spring 12 to move out of the substrate plane, and the constraint mechanism 32 will ensure a specific well-defined geometric angle. Thereafter, providing a mechanism, such as voltage source 50, causes the structure to move back into the plane of the substrate 20. Once the voltage source 50 is removed, the present design will reassemble itself to the specifically defined geometric configuration. The action is repeatable as the voltage source, or other mechanism, used to move the structure is applied and removed.

It is to be appreciated that while a particular constraint structure is described, other constraining designs could be used to accomplish the concepts of the present invention.

It is to be appreciated, while the present invention has been described more particularly with attention to an optical surface such as a mirror, it is not limited to this concept. It may, in some instances, be useful to design a three-dimensional object having a defined angle, without the mirror structure, which is self-assembling.

The foregoing is considered as illustrative only of the principles of the invention. Further, since numerous modifications and changes will readily occur to those skilled in the art, it is not desired to limit the invention to the exact construction and operation as shown and described, and accordingly, all suitable modifications and equivalents may be resorted to falling within the scope of the invention.

Having thus described the invention, it is now claimed:

1. A MEMS structure comprising:

a substrate;

a spring comprising a material initially fixed to the substrate along a length of the spring, the material having an inherent stress gradient therein when initially fixed to the substrate;

a non-stressed constraint plate deposited on the substrate, the non-stressed constraint plate having a minimal inherent stress gradient;

a hinge member, a first portion of the hinge member connected to the spring, and a second portion of the hinge member connected to the non-stressed constraint plate; and a constraint mechanism formed on the substrate, such that at least a portion of the constraint plate is in control of the constraint mechanism, wherein at least a free portion of the spring and the constraint plate are released from the substrate while an anchor portion of the spring remains fixed to the substrate and the inherent stress gradient biases the free portion away from the substrate until constrained by the constraint mechanism.

2. The invention according to claim 1 wherein the MEMS structure is self-assembling.

3. The invention according to claim 2 wherein the MEMS structure is collapsible back to the substrate.

4. The invention according to claim 3 wherein the MEMS structure is repeatedly self-assembling.

5. The invention according to claim 1 further including a reflective layer deposited on a surface of the spring.

6. The invention according to claim 2 wherein the self-assembling MEMS structure is configured to self-assemble to a predetermined fixed angle from the substrate.

7. The invention according to claim 6 wherein the constraint mechanism determines the predetermined fixed angle from the substrate, at which the MEMS structure is self-assembled.

8. The invention according to claim 7 wherein the inherent stress gradient of the spring determines the predetermined fixed angle from the substrate, at which the MEMS structure is self-assembled.

9. The invention according to claim 3 further including a voltage source attached to the MEMS structure, wherein upon application of a voltage from the voltage source, the spring is pulled back to the substrate.

* * * * *